(12) United States Patent
Fiedler et al.

(10) Patent No.: US 6,768,296 B2
(45) Date of Patent: Jul. 27, 2004

(54) CIRCUIT ARRANGEMENT FOR GENERATING SQUARE PULSES AND IMPROVED COMPENSATION CURRENT SENSOR USING SAME

(75) Inventors: Gerhard Fiedler, Neckartailfingen (DE); Volker Haller, Gomaringen (DE); Christoph Wenger, Korntal-Muenchingen (DE); Guenter Nasswetter, Gomaringen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/089,209

(22) PCT Filed: Jul. 28, 2001

(86) PCT No.: PCT/DE01/02866

§ 371 (c)(1),
(2), (4) Date: Mar. 26, 2002

(87) PCT Pub. No.: WO02/15399

PCT Pub. Date: Feb. 21, 2002

(65) Prior Publication Data

US 2002/0149412 A1 Oct. 17, 2002

(30) Foreign Application Priority Data

Aug. 12, 2000 (DE) .......................................... 100 39 473

(51) Int. Cl.[7] .............................................. G01R 19/00
(52) U.S. Cl. .................................. 324/117 R; 324/127
(58) Field of Search ............................ 324/117 R, 127, 324/207.19, 252; 327/110, 291, 423, 424; 323/356

(56) References Cited

U.S. PATENT DOCUMENTS

| | | | |
|---|---|---|---|
| 4,298,838 A | 11/1981 | Akamatsu | |
| 4,300,223 A | * 11/1981 | Maire | ........................... 368/85 |
| 4,347,469 A | 8/1982 | Dinger | |
| 4,851,775 A | 7/1989 | Kim | |
| 4,879,641 A | * 11/1989 | Rossi et al. | .................... 363/98 |
| 5,372,045 A | * 12/1994 | Schulz et al. | ............ 73/861.12 |
| 5,457,364 A | * 10/1995 | Bilotti et al. | ................ 318/434 |
| 5,552,979 A | 9/1996 | Gu | |
| 5,712,550 A | * 1/1998 | Boll et al. | ................... 318/434 |
| 5,757,184 A | 5/1998 | Aizawa | |
| 5,828,295 A | * 10/1998 | Mittel et al. | .............. 340/407.1 |
| 6,384,556 B1 | * 5/2002 | Mizumoto et al. | ........... 318/293 |

FOREIGN PATENT DOCUMENTS

| | | |
|---|---|---|
| DE | 198 44 729 A | 12/1999 |
| EP | 0 261 707 A | 3/1988 |

\* cited by examiner

Primary Examiner—Ernest Karlsen
(74) Attorney, Agent, or Firm—Michael J. Striker

(57) ABSTRACT

The circuit arrangement for generating square pulses according to a magnetic field strength has an edge-triggered flip-flop a comparator connected to the flip-flop; a bridge with four bridge segments, each including an electronically controlled switch, and with a transverse branch including an energy-storing element consisting of an inductive resistor acting as a magnetic field probe; and a switching threshold resistor connected with the energy-storing element and with a signal input of the comparator. The switches are each connected in pairs in crossover fashion by the flip-flop, so that current flow in the transverse branch is reversible. An improved compensation current sensor, which is less sensitive to component tolerances, includes the circuit arrangement for generating square pulses in a controller.

10 Claims, 2 Drawing Sheets

CIRCUIT ARRANGEMENT FOR GENERATING SQUARE PULSES AND IMPROVED COMPENSATION CURRENT SENSOR USING SAME

PRIOR ART

The invention relates to a circuit arrangement for generating square pulses, having an edge-triggered flip-flop and at least one comparator, whose output is connected to the trigger input of the flip-flop, and an energy-storing element, which is charged in alternation as a function of the switching state of the flip-flop, and at least one switching threshold resistor is connected in series with the energy-storing element, at which resistor a voltage generated by the current flowing through the energy-storing element drops, which voltage is fed to the signal input of the comparator.

Using such a circuit arrangement to generate square pulses is known. The known circuit is used for instance to measure the field intensity of a magnetic field. A magnetic field probe, which is embodied as an inductive resistor and represents the energy-storing element, is placed in the magnetic field to be measured. The magnetic field probe is embodied such that it is brought to saturation by the magnetic field to be measured and the magnetic field generated by the current. As long as no external magnetic field acts on the magnetic field probe, or in other words the magnetic field to be measured is zero, the magnetic field probe has an electrical behavior that, in terms of an electric current flowing through it, is independent of the direction of the current. The square pulses generated by the circuit arrangement, as a result, have a pulse-duty factor of 1:1.

If an external magnetic field acts on the magnetic field probe, that is, if the magnetic field to be measured is no longer zero, then magnetic field probe reaches saturation earlier in one direction than in the other. With respect to an electric current flowing through it, its behavior is therefore no longer dependent on the direction of the electric current. As a result, the pulse-duty factor of the square pulses changes. Hence the pulse-duty factor of the square pulses represents a measure of the magnetic field acting on the magnetic field probe.

Figure 3:
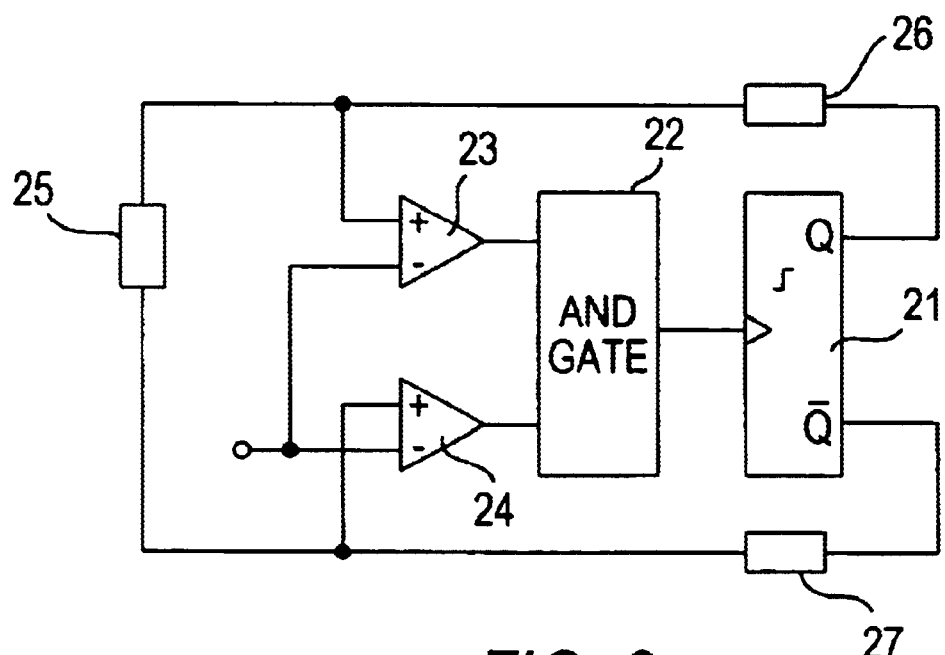

A known circuit arrangement is shown in FIG. 3. In the known circuit arrangement, two comparators are provided, whose outputs are fed to an AND gate 22, whose output is connected to the trigger input of the flip-flop 21. The signal inputs of the comparators are each connected to a different end of the energy store, that is, of the magnetic field probe. The energy store is connected between the two outputs of the flip-flop. Thus depending on the position of the flip-flop, current flows in a different direction through the energy store. Between the outputs of the flip-flop and the energy store, respective switching threshold resistors are connected. The junction points of the switching threshold resistors and the energy store are each connected to the signal input of a comparator. The two reference inputs of the comparators are connected to one another, so that the same reference voltage is present at both comparators.

At the output of the flip-flop at which there was no output voltage, there is now an output voltage after a switchover of the flip-flop, and there is no longer an output voltage at the other output. By means of the energy stored in the coil, the original current flow is, however, maintained. As a result, the potential at the signal input of the applicable comparator drops below the switching threshold. As a consequence, the voltage at the output of the applicable comparator becomes zero. As a result, the output of the AND gate also becomes zero, so that the voltage at the signal input of the applicable comparator again reaches the switching threshold, causing the comparator again to output an output signal, and the AND gate is switched through. By means of the edge occurring upon switching of the AND gate, the flip-flop is triggered again, so that it switches over once again, and the process just described is repeated. The circuit is dimensioned such that it oscillates at a frequency of approximately 350 kHz.

However, the known circuit has the disadvantage that the tolerances of the switching threshold resistors and the tolerances of the switching thresholds of the comparators affect the pulse-duty factor. Moreover, different delay times of the comparators adversely affect the symmetry of the circuit arrangement. The transit time of the AND gate also adversely affects the resolution achieved with the circuit. Furthermore, additional costs result from the use of an AND gate.

It is an object of the invention to provide a circuit arrangement for generating square pulses of the above-described kind in which th influence of tolerance in the components is lessened.

It is another object of the present invention to provide an improved compensation current sensor for current flowing in an electrically conducting element with a controller, which includes the circuit arrangement for generating square pulses according to the invention.

ADVANTAGES OF THE INVENTION

According to the invention, a circuit arrangement for generating square pulses, having an edge-triggered flip-flop and at least one comparator, whose output is connected to the trigger input of the flip-flop, and an energy-storing element, which is charged in alternation as a function of the switching state of the flip-flop, and at least one switching threshold resistor is connected in series with the energy-storing element, at which resistor a voltage generated by the current flowing through the energy-storing element drops, which voltage is fed to the signal input of the comparator, is characterized in that the energy-storing element is disposed in the transverse branch of a bridge, in each of the four bridge segments of which a respective switch is disposed, and the switches are each connected in pairs in crossover fashion by the flip-flop, so that the current flow in the transverse branch is reversible, and that the bridge is connected in series with the switching threshold resistor, and the junction point of the bridge to the switching threshold resistor is connected to the signal input of the comparator.

By means of the arrangement according to the invention, it is advantageously unnecessary to have two switching threshold resistors. Not only is the space required reduced, but by using only one switching threshold resistor, asymmetries are avoided. This is because the current flowing through the energy store always flows through the same switching threshold resistor, and thus the tolerance of the switching threshold resistor has the same effect in both switching states of the flip-flop.

The same is true for a tolerance of the comparator. Since only one comparator is used, tolerances in terms of the switching threshold and the transit time in both switching states of the flip-flop have the same effect. Moreover, both space and expense are saved by using only one comparator.

Since in the circuit arrangement of the invention an AND gate is no longer necessary, the transit times caused by such an element cannot have any effect. Omitting the AND gate advantageously also saves space.

An embodiment of the invention in which the energy-storing element is an inductive resistor has proved especially advantageous. Because the energy-storing element is an inductive resistor, it can be embodied as a magnetic field probe, as provided in a further particular embodiment of the invention. When the inductive resistor is embodied as a magnetic field probe, the circuit arrangement of the invention can especially advantageously be used for measuring a magnetic field.

It is especially advantageous if the magnetic field probe is used to detect the magnetic field of a core of a compensation current sensor, as is contemplated in a further particular embodiment of the invention. By using the circuit arrangement of the invention in a compensation current sensor, the accuracy of the compensation current sensor can be improved in a simple way.

In an advantageous feature of the invention, the comparator is embodied as a digital gate. As a result, the circuit can be produced quite economically. An AND gate could for instance be used as the digital gate. However, it has also proved advantageous to use an analog comparator, which as its output signals furnishes digital signals that are simple to process further.

In a further particular embodiment of the invention, it is advantageously provided that the switches are MOSFETs, of which two are triggered directly and two are triggered via inverters from the outputs of the flip-flop. Embodying the switches as MOSFETs makes it simple to realize the circuit arrangement of the invention. Moreover, triggering of the switches is made simpler. In addition, the switches can be triggered quite precisely.

It has furthermore been found that it is especially advantageous if in the transverse branch of the bridge, a series resistor is connected in series with the energy-storing element. By means of the series resistor, the sensitivity of the circuit arrangement can be adjusted in a simple way.

Further details, characteristics and advantages of the present invention will become apparent from the ensuing description of a particular exemplary embodiment in conjunction with the drawing.

DRAWING

Figure 1:
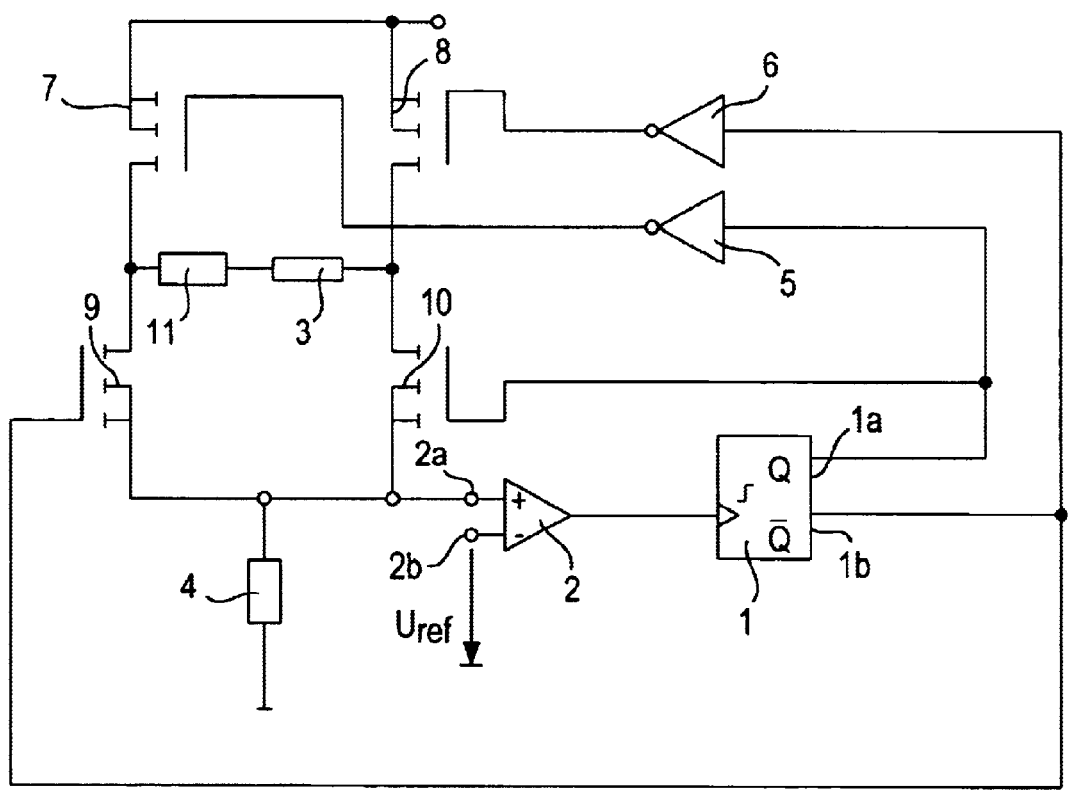
Figure 2:
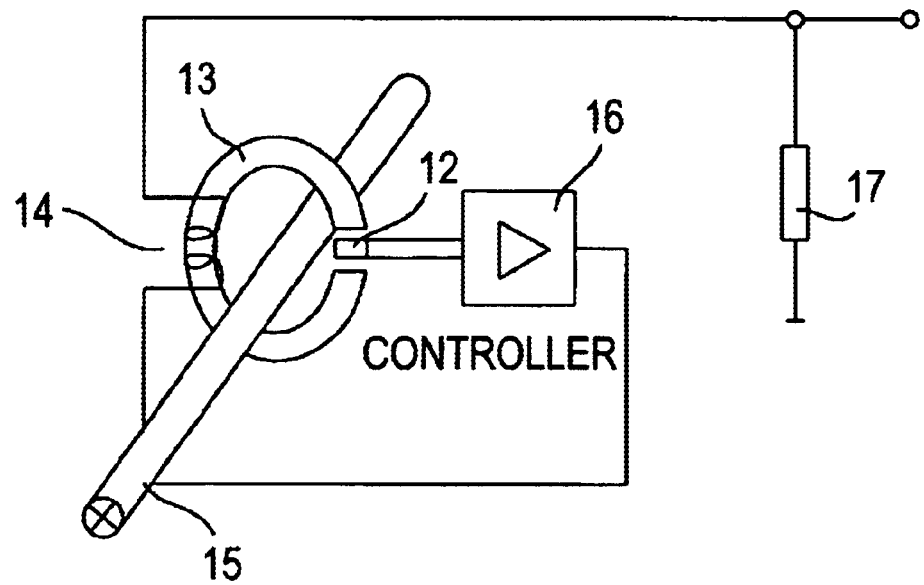

Shown are:

FIG. 1, one embodiment of the circuit arrangement of the invention in a schematic diagram;

FIG. 2, a compensation current sensor in a schematic diagram; and

FIG. 3, a circuit arrangement of the prior art in a schematic diagram.

DESCRIPTION OF THE EXEMPLARY EMBODIMENTS

As can be seen from FIG. 1, a coil 3 and a series resistor 11 connected in series with it are disposed in the transverse branch of a bridge. One switch 7, 8, 9, 10 embodied as a MOSFET is disposed in each of the four bridge segments of the bridge. The first switch 7, disposed in one part of the bridge, and the second switch 8 are embodied as p-channel MOSFETs and connected to the operating voltage VCC. The third switch 9 disposed in the other part of the bridge and the fourth switch 10 are embodied as n-channel MOSFETs and connected to a switching threshold resistor 4. The other end of the switching threshold resistor 4 is connected to ground.

The junction point between the n-channel MOSFETs 9, 10 and the switching threshold resistor 4 is connected to the signal input 2a of a comparator 2. A reference voltage $U_{ref}$ is applied to the reference input 2b of the comparator 2. The output of the comparator 2 is connected to the trigger input of an edge-triggered flip-flop 1. The non-inverting output 1a of the flip-flop 1 is connected, via a first inverter 5, to the gate of the first, p-channel MOSFET 7 as well as being connected directly to the gate of the fourth, n-channel MOSFET 10, disposed in crossover fashion in the bridge. The inverting output 1b of the flip-flop 1 is connected, via a second inverter 6, to the gate of the second, p-channel MOSFET 8 as well as being connected directly to the gate of the third, n-channel MOSFET 9, disposed in crossover fashion in the bridge. The MOSFETs 7, 8, 9, 10 are thus connected through in pairs in crossover fashion (7 and 10, on the one hand, and 8 and 9, on the other) by the flip-flop 1.

If the output voltage is applied to the non-inverting output 1a of the flip-flop 1, then the first MOSFET 7 and the fourth MOSFET 10 are switched through. A current can thus flow from left to right in the transverse branch of the bridge, or in other words can flow through the series resistor 11 and the inductive resistor 3.

If the flip-flop 1 switches over, then the output voltage is applied to the inverting output 1b of the flip-flop 1. As a result, the first MOSFET 7 and the fourth MOSFET 10 block, while conversely the second MOSFET 8 and the third MOSFET 9 are switched through.

Because the current flow in FIG. 2 from left to right through the transverse branch of the bridge is maintained as a result of the storage action of the inductive resistor 3, the voltage at the signal input 2a of the inverter 2 drops below the value of the reference voltage $U_{ref}$ located at the reference input 2b of the comparator 2. As a result, the output signal of the comparator becomes zero.

Once the direction of the current in the transverse branch of the bridge has reversed, because of the switching through of the second MOSFET 8 and the third MOSFET 9, or in other words once the current is now flowing from right to left through the transverse branch of the bridge or in other words through the inductive resistor 3 and the series resistor 11, the voltage drop brought about at the switching threshold resistor 4 increases again. Once it has reached the switching threshold of the comparator 2, the output voltage again prevails at the output of the comparator 2. By means of the edge created by the switchover of the comparator 2, the flip-flop 1 is triggered, so that it switches over once again. The switching cycle described above thus begins all over again.

The comparator 2 is for instance an analog comparator, which at its output furnishes a digital signal, which be processed simply in the downstream digital circuit. As the comparator 2, it is for instance also possible to use a component designed as a digital gate, optionally with a suitably adapted circuit design.

In the circuit arrangement of a compensation current sensor, shown in FIG. 2, a field probe 12 is disposed in the air gap of an annular core 13 that surrounds a conductor 15 whose current is to be measured. The field probe 12 is embodied as an inductive resistor, which reaches saturation as a result of the magnetic field in the air gap of the annular core 13. The field probe 12 is the inductive resistor 3 included in FIG. 1, and it is disposed in a circuit arrangement of FIG. 1 that forms part of a controller 16. The pulse-duty factor, brought about by the magnetic field in the air gap of the annular core 13, of the square pulses generated by the circuit arrangement in FIG. 1 is evaluated in the controller 16 and used to generate a compensation current $I_A$. The compensation current $I_A$ is conducted through a coil 14 that is wound around the annular core 13.

The controller 16 is designed such that the current flowing through the coil 14 is high enough that the magnetic field in the air gap of the annular core 13 is nearly zero. As a result, the current $I_A$ flowing through the coil 14 can be used as a measure for the current flowing through the conductor 15. To generate an output voltage $U_A$, a resistor 17, at which the output voltage $U_A$ drops, is connected in series with the coil 14.

In FIG. 3, the known circuit arrangement, discussed in the background section above, is shown. As can be seen from FIG. 3, an inductive resistor 25 is connected between the outputs of an edge-triggered flip-flop 21. Depending on the position of the flip-flop 21, current thus flows in a different direction through the inductive resistor 25. A respective switching threshold resistor 26, 27 is connected between the outputs of the flip-flop 21 and the inductive resistor 25. The junction point of the switching threshold resistors 26, 27 is connected to the signal input of a respective comparator 23, 24. The two reference inputs of the comparators 23, 24 are connected to one another, so that the same reference voltage is present at both comparators. The outputs of the comparators 23, 24 are connected to the two inputs of an AND gate 22. The output signals of these comparators thus affect the switching states of the AND gate. The output of the AND gate 22 is connected to the trigger input of the flip-flop 21.

For further information on the mode of operation of the known circuit shown in FIG. 3, see the background section above.

What is claimed is:

1. A circuit arrangement for generating square pulses as a function of field intensity of a magnetic field, said circuit arrangement comprising an edge-triggered flip-flop (1) having a trigger input;

at least one comparator (2) having a signal input (2a) and an output connected to the trigger input of the flip-flop (1);

a bridge comprising four bridge segments connected in series with each other and a transverse branch connected across said bridge between said bridge segments, wherein respective bridge segments comprise corresponding switches (7, 8, 9, 10), said transverse branch comprises an energy-storing element (3) alternately charged as a function of switching state of the edge-triggered flip-flop (1) and said energy-storing element (3) consists of a magnetic field probe (12) for detecting a magnetic field, which consists of an inductive resistor; and at least one switching threshold resistor (4) connected in series with said energy-storing element (3), which is connected with said signal input (2a) of said at least one comparator (2), so that a voltage is applied to said signal input due to current flowing through the energy-storing element (3); and wherein pairs (7, 10 or 8; 9) of said switches on opposite sides of the transverse branch are connected by said flip-flop (1) in crossover fashion, so that said current flowing in said energy-storing element (3) is reversible, and wherein a junction point of the bridge to the at least one switching threshold resistor (4) is connected to said signal input (2a) of the at least one comparator (2).

2. The circuit arrangement as defined in claim 1, wherein said magnetic fiord is generated by a core (13) of a compensation current sensor.

3. The circuit arrangement as defined in claim 1, wherein said at least one comparator (2) is a digital gate.

4. The circuit arrangement as defined in 17, further comprising inverters (5,6) connected to outputs of said flip-flop (1) and wherein said respective switches (7, 8, 9.10) are MOSFETs, one of said outputs of said flip-flop (1) is directly connected to a first (10) of said switches and indirectly to a second (7) of said switches via an inverter (5) and another of said outputs of said flip-flop (1) is directly connected to a third (9) of said switches and indirectly connected to a fourth (8) of said switches via another inverter (6), in order to switch said switches in said crossover fashion.

5. The circuit arrangement as defined in 1, wherein said transverse branch comprises a series resistor (11) connected in series with said energy-storing element (3) or said inductive resistor.

6. A compensation current sensor for measuring current flowing in an electrically conducting element, said compensation current sensor comprising an annular core (13) with an air gap, through which an electrical conductor carrying a current to be measured passes;

an electrically conductive coli (14) wound around said annular core (13);

a magnetic field probe (12) arranged in said air gap of said annular core (13), said magnetic field probe consisting of an inductive resistor and comprising means for detecting a magnetic field in said air gap of said annular core; and a controller (16) for generating a compensation current ($I_A$) passing through said coil (14);

wherein said controller (16) comprises a circuit arrangement for generating square pulses according to field intensity of said magnetic field of said annular core, said circuit arrangement comprising an edge-triggered flip-flop (1) having a trigger input; at least one comparator (2) having an output connected to the trigger input of the flip-flop (1); a bridge comprising four bridge segments connected in series with each other and a transverse branch connected across said bridge between said bridge segments, wherein respective bridge segments comprise corresponding switches (7, 8, 9, 10), said transverse branch comprises an nergy-storing element (3) alternately charged as a function of switching state of the flip-flop (1) and said energy-storing element (3) consists of said magnetic field probe (12), which consists of an inductive resistor; and at least one switching threshold resistor (4) connected in series with said energy-storing element (3), which is connected with a signal input (2a) of said at least one comparator (2), so that a voltage is applied to said signal input due to current flowing through the energy-storing element (3); wherein said switches are connected in pairs in crossover fashion by said flip-flop (1), so that said current flowing in said energy-storing element (3) is reversible, and wherein a junction point of the bridge to the at least one switching threshold resistor (4) is connected to said signal input (2a) of the at least one comparator (2).

7. The compensation current sensor as defined in claim 6, wherein said controller (16) Includes means for generating a compensation current ($I_A$) from a pulse-duty factor of said square pulses and means for conducting said compensation current ($I_A$) through said coil (14) wound around said annular core (13), whereby said field intensity of said magnetic field is nearly zero.

8. The compensation current sensor as defined in claim 6, wherein said at least one comparator (2) is a digital gate.

9. The compensation current sensor as defined in claim 6, wherein said circuit arrangement includes inverters (5,6) connected to outputs of said flip-flop (1) and wherein said respective switches (7, 8, 9, 10) are MOSFETs, one of said outputs of said flip-flop (1) Is directly connected to a first (10) of said switches and indirectly to a second (7) of said switches via an inverter (5) and another of said outputs of said flip-flop (1) is directly connected to a third (9) of said switches and indirectly connected to a fourth (8) of said switches via another inverter (6) connected to another of said outputs of said flip-flop (1), in order to switch said switches in said crossover fashion.

10. The compensation current sensor as defined in claim 6, wherein said transverse branch comprises a series resistor (11) connected in series with said energy-storing element or said inductive resistor.

* * * * *